(12) United States Patent
Suzuki et al.

(10) Patent No.: US 12,409,527 B2
(45) Date of Patent: Sep. 9, 2025

(54) GRINDING METHOD FOR CIRCULAR PLATE-SHAPED WORKPIECE

(71) Applicant: DISCO CORPORATION, Tokyo (JP)

(72) Inventors: Yoshikazu Suzuki, Tokyo (JP); Daisuke Tanemura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 333 days.

(21) Appl. No.: 18/152,262

(22) Filed: Jan. 10, 2023

(65) Prior Publication Data

US 2023/0234179 A1 Jul. 27, 2023

(30) Foreign Application Priority Data

Jan. 27, 2022 (JP) .................................. 2022-010701

(51) Int. Cl.
*B24B 7/22* (2006.01)
*H01L 21/304* (2006.01)

(52) U.S. Cl.
CPC ............ *B24B 7/228* (2013.01); *H01L 21/304* (2013.01)

(58) Field of Classification Search
CPC .................. B24B 7/228; B24B 37/042; B24B 37/10–105; B24B 37/16; B24B 37/14; H01L 21/02016; H01L 21/304
USPC .................. 451/41, 283, 285, 287, 290, 550
See application file for complete search history.

(56) References Cited

U.S. PATENT DOCUMENTS

| 10,112,285 B2 * | 10/2018 | Fujiya ..................... B24B 55/02 |
| 10,115,578 B2 * | 10/2018 | Nishihara ............... H01L 21/78 |
| 2008/0090505 A1 | 4/2008 | Yoshida et al. |
| 2009/0020854 A1 | 1/2009 | Feng et al. |

FOREIGN PATENT DOCUMENTS

| JP | 2007019461 A | 1/2007 | |
| JP | 2007266352 A * | 10/2007 | ....... H01L 21/67092 |
| JP | 200898351 A | 4/2008 | |

OTHER PUBLICATIONS

Machine translation of JP-2007266352-A (Year: 2007).*
Japanese Patent Application No. 2022-010701 : English translation of Office Action, Jul. 29, 2025 (3 pages).

* cited by examiner

*Primary Examiner* — Robert F Neibaur
(74) *Attorney, Agent, or Firm* — Greer, Burns & Crain, Ltd

(57) ABSTRACT

There is provided a grinding method that is applied when a workpiece having a first surface and a second surface is to be ground from the second surface. The grinding method includes a first grinding step of causing first grindstones to come into contact with the workpiece to grind the workpiece and thereby form on the workpiece a circular plate-shaped first thin plate portion and an annular first thick plate portion surrounding the first thin plate portion, and a second grinding step of causing second grindstones to come into contact with the first thick plate portion and the first thin plate portion to grind the workpiece and thereby form on the workpiece a thin circular plate-shaped second thin plate portion that has a larger diameter than the first thin plate portion and an annular second thick plate portion surrounding the second thin plate portion.

20 Claims, 10 Drawing Sheets

GRINDING METHOD FOR CIRCULAR PLATE-SHAPED WORKPIECE

BACKGROUND OF THE INVENTION

Field of the Invention

The present invention relates to a grinding method applied when a circular plate-shaped workpiece such as a wafer is to be ground.

Description of the Related Art

There are increasing situations for performing processing to thin a wafer with a face side on which devices such as integrated circuits (ICs) are provided, in order to realize small and light device chips. For example, the face side of the wafer is held on a chuck table, and a grinding wheel to which grindstones including abrasive grains are fixed and the chuck table are mutually rotated. Then, the grindstones are pressed against a reverse side of the wafer while liquid such as pure water is supplied, so that the wafer is ground and thinned.

When the wafer is in whole thinned by the above-mentioned method, the rigidness of the wafer substantially declines, creating difficulty in handling the wafer in subsequent steps. As such, there has been proposed a technique of maintaining high rigidness of a ground wafer by using a grinding wheel with a smaller diameter than the wafer to grind an area on a central side (inner side) of the wafer on which devices are formed and leave an area on an outer edge side (outer side) unground (see, for example, Japanese Patent Laid-open No. 2007-19461).

In the technique, first, the area on the central side of the wafer is coarsely ground by a first grinding wheel to which grindstones including relatively large abrasive grains are fixed, so that a circular plate-shaped thin plate portion and an annular thick plate portion surrounding the thin plate portion are formed on the wafer. Accordingly, using a grinding wheel to which grindstones including large abrasive grains are fixed requires a short period of time for grinding the wafer compared to using a grinding wheel to which grindstones including small abrasive grains are fixed.

Meanwhile, coarsely grinding the wafer by a grinding wheel to which grindstones including large abrasive grains are fixed leads to formation of a damaged layer including scratches and distortions attributable to the grindstones on the ground side of the wafer, possibly resulting in insufficient mechanical strength (die strength) of the thin plate portion. As such, after the wafer has been coarsely ground, the thin plate portion is further ground by a grinding wheel to which grindstones including relatively small abrasive grains are fixed, so that the damaged layer is removed.

SUMMARY OF THE INVENTION

Incidentally, when the grinding wheel comes into contact with, for example, an inner side surface of the thick plate portion when the thin plate portion is further ground to remove the damaged layer, the thick plate portion is sometimes chipped. Hence, at the time of removing the damaged layer, only the area on the central side of the thin plate portion had been ground so that the grinding wheel would not come into contact with the thick plate portion. However, this method leaves the damaged layer in the area on the outer edge side of the thin plate portion (an area near the boundary between the thin plate portion and the thick plate portion), making it difficult to use this area for products.

It is accordingly an object of the present invention to provide a grinding method that is capable of reserving, to a maximum extent, an effective area that can be used for products without requiring a considerably long period of time compared to the grinding method used in the related art, at the time of grinding a circular plate-shaped workpiece and forming a thin plate portion and a thick plate portion thereon.

In accordance with an aspect of the present invention, there is provided a grinding method applied when a circular plate-shaped workpiece having a first surface and a second surface on an opposite side of the first surface is to be ground from the second surface, the grinding method including a first grinding step of moving the workpiece and a first grinding wheel in which a plurality of first grindstones each including abrasive grains are arrayed in an annular area with a first dimeter smaller than a diameter of the workpiece relative to each other in a first direction that intersects with the second surface, while mutually rotating the workpiece and the first grinding wheel, and causing the first grindstones to come into contact with the workpiece from the second surface side, to grind the workpiece and thereby form on the workpiece a circular plate-shaped first thin plate portion and an annular first thick plate portion surrounding the first thin plate portion, and a second grinding step of, after the first grinding step, moving the workpiece and a second grinding wheel in which a plurality of second grindstones each including abrasive grains smaller than those included in the first grindstones are arrayed in an annular area with a second dimeter smaller than the diameter of the workpiece relative to each other in a second direction that intersects with the second surface, while mutually rotating the workpiece and the second grinding wheel, and causing the second grindstones to come into contact with the first thick plate portion and the first thin plate portion from the second surface side, to grind the workpiece and thereby form on the workpiece a thin circular plate-shaped second thin plate portion that has a larger diameter than the first thin plate portion and an annular second thick plate portion surrounding the second thin plate portion, in which, in the second grinding step, the second grindstones are caused to come into contact with an area on the second surface that remains on the first thick plate portion at a distance of equal to or more than a width of the second grindstones in a direction of the second diameter from an inner edge of the second surface toward an outer side.

Preferably, in the first grinding step, while the first grinding wheel and the workpiece are moved relative to each other in a direction perpendicular to the second surface, a center of rotation of the first grinding wheel and a center of rotation of the workpiece are caused to come close to each other in a direction parallel to the second surface.

Further, preferably, in the second grinding step, while the second grinding wheel and the workpiece are moved relative to each other in a direction perpendicular to the second surface, a center of rotation of the second grinding wheel and a center of rotation of the workpiece are caused to come close to each other in a direction parallel to the second surface.

In the grinding method according to one aspect of the present invention, after the workpiece is ground by the first grinding wheel including the first grindstones and the first thin plate portion and the first thick plate portion are formed on the wafer, the second grinding wheel that includes the second grindstones including smaller abrasive grains than the first grindstones grinds the first thick plate portion and the first thin plate portion to form the second thin plate portion and the second thick plate portion on the wafer, so that the second thin plate portion in whole becomes an effective area that has no damaged layer generated by the first grindstones.

Moreover, since the volume of portion of the first thick plate portion removed by the second grinding wheel is sufficiently small, for example, the length of time required for grinding does not become considerably long compared to the length of time required in the grinding method in the related art in which the second grinding wheel grinds only the area on the central side of the first thin plate portion and not the first thick plate portion at all. Hence, the grinding method according to one aspect of the present invention reserves, to a maximum extent, an effective area that can be used for products without requiring a considerably longer time than the grinding method in the related art.

Further, in the grinding method according to one aspect of the present invention, at the time of grinding the first thick plate portion and the first thin plate portion by the second grinding wheel, the second grindstones come into contact with the area on the second surface that remains on the first thick plate portion at a distance of equal to or more than the width of the second grindstones (width of the second grindstones in the direction of the second diameter) from the inner edge of the second surface toward the outer side.

As a result, the innermost portion of the second grindstones (the portion in the innermost position in the direction of the second diameter) always comes into contact with the first thick plate portion at some point in time, so that the wear of the inner portion of the second grindstones can appropriately proceed in association with the wear of the outer portion thereof, preventing uneven wear in which only the outer portion of the second grindstones wears from proceeding.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
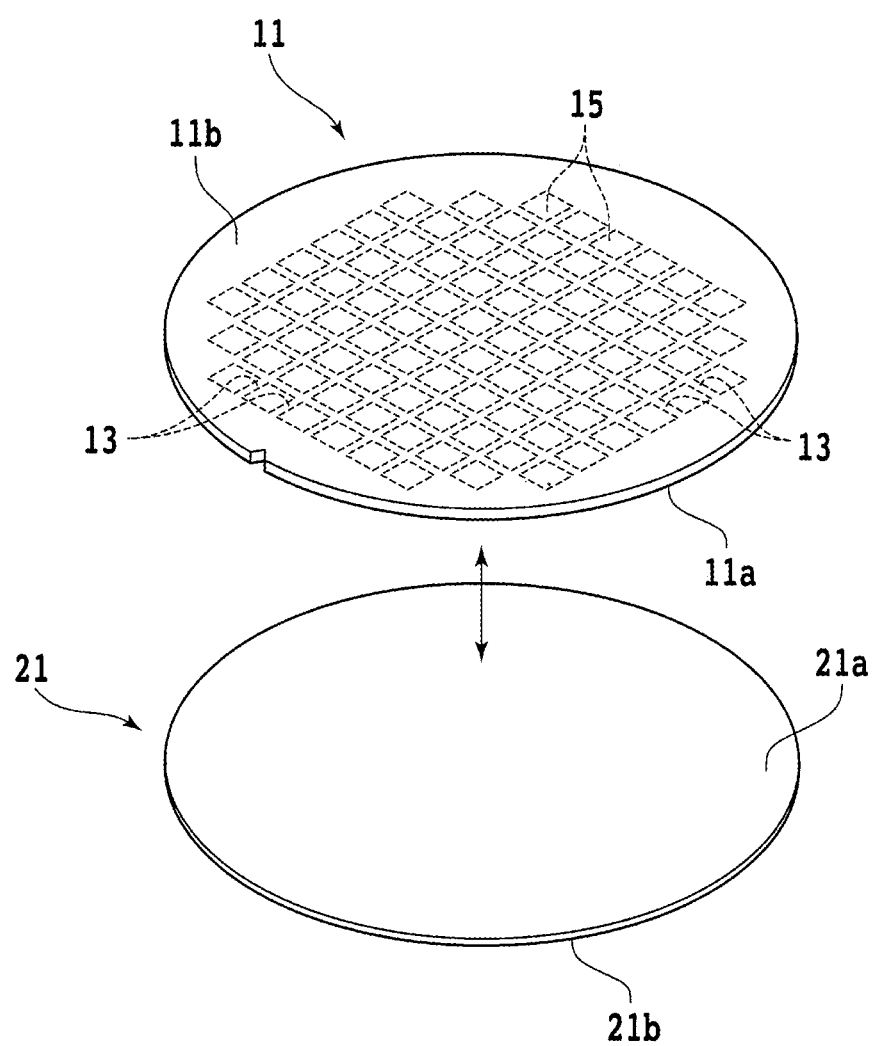
FIG. 1 is a perspective view schematically illustrating a state in which a protective member is affixed to a circular plate-shaped workpiece.

An embodiment of the present invention will hereinafter be described with reference to the attached drawings. In a grinding method according to the present embodiment, first, a protective member is affixed to a circular plate-shaped workpiece that is to be ground (affixing step). FIG. 1 is a perspective view schematically illustrating a state in which a protective member 21 is attached to a circular plate-shaped workpiece 11.

The workpiece 11 is, for example, a circular plate-shaped wafer configured from a semiconductor such as silicon (Si). That is, the workpiece 11 has a circular front side (first surface) 11a and a circular reverse side (second surface) 11b on an opposite side of the front side 11a. The front side 11a of the workpiece 11 is partitioned into a plurality of small areas by a plurality of streets (projected dicing lines) 13 in crisscross relation. In the small areas, devices 15 such as ICs are formed.

In the grinding method according to the present embodiment, a portion of the workpiece 11 that corresponds to an area (device area) in which the devices 15 are formed is ground from the reverse side 11b, so that part of the workpiece 11 is thinned. Specifically, in the grinding method according to the present embodiment, the workpiece 11 is processed from the reverse side 11b to have a recessed shape.

Note that, in the present embodiment, a circular plate-shaped wafer configured from a semiconductor such as silicon is used as the workpiece 11, but a material, a shape, a structure, a size, and the like of the workpiece 11 are not limited to the forms described above. For example, substrates configured from such materials as other semiconductors, ceramic, resin, or metal can be used as the workpiece 11. Similarly, the type, the number, the shape, the structure, the size, the arrangement, and the like of the devices 15 are not limited to the above-mentioned forms. The workpiece 11 may not have the devices 15 formed thereon.

The protective member 21 to be affixed to the workpiece 11 is typically a circular tape (film), resin substrate, wafer of the same or different kind with respect to the workpiece 11, or the like that has a diameter substantially equal to that of the workpiece 11. On a front side 21a of the protective member 21, an adhesive layer demonstrating adhesive property with respect to the workpiece 11 is provided.

Accordingly, as depicted in FIG. 1, bringing the front side 21a of the protective member 21 into close contact with the front side 11a of the workpiece 11 allows the protective member 21 to be affixed to the front side 11a of the workpiece 11. Thus, impact caused to the front side 11a of the workpiece 11 at the time when the workpiece 11 is ground from the reverse side 11b is reduced by the protective member 21, and the devices 15 and the like of the workpiece 11 are protected.

Figure 2:
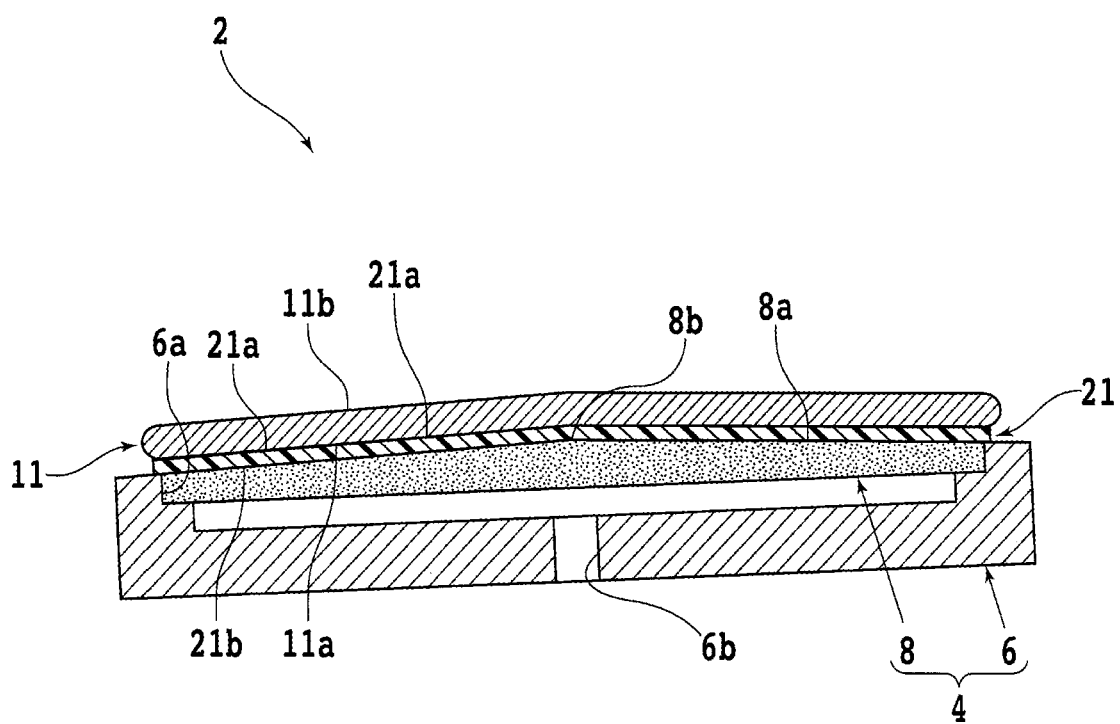
FIG. 2 is a cross sectional view schematically illustrating a state in which the workpiece is held on a chuck table through the protective member.

After the protective member 21 is affixed to the front side 11a of the workpiece 11, the workpiece 11 is held on a chuck table through the protective member 21 (holding step). FIG. 2 is a cross sectional view schematically illustrating a state in which the workpiece 11 is held on a chuck table 4 of a grinding apparatus 2 through the protective member 21. Note that in the steps described below, the grinding apparatus 2 illustrated in FIG. 2 or the like is used.

The grinding apparatus 2 includes the chuck table 4 configured to be capable of holding the workpiece 11. The chuck table 4 includes, for example, a circular plate-shaped frame body 6 that is formed with use of ceramic, metal, or the like. On an upper surface side of the frame body 6, there is formed a recessed portion 6a which has a circular opening on its upper end. To the recessed portion 6a, fixed is a porous holding plate 8 formed in a circular plate shape with use of ceramic or the like.

An upper surface 8a of the holding plate 8 is, for example, configured in a shape corresponding to a conical surface and functions as a holding surface for holding the workpiece 11 or the like. Note that the difference in height (height difference) between a center 8b of the upper surface 8a of the holding plate 8 and an outer peripheral edge of the upper surface 8a of the holding plate 8 is approximately 10 to 30 µm. In the present embodiment, the upper surface (holding surface) 8a of the holding plate 8 comes into contact with a reverse side 21b of the protective member 21.

A lower surface side of the holding plate 8 is connected to a suction source (not illustrated) such as an ejector through a suction channel 6b provided inside the frame body 6, a valve (not illustrated) disposed outside of the frame body 6, and the like. Hence, when the valve is opened and a negative pressure generated at the suction source is caused to act in a state in which the reverse side 21b of the protective member 21 is in contact with the upper surface 8a of the holding plate 8, the reverse side 21b of the protective member 21 is sucked by the chuck table 4. That is, the workpiece 11 is held on the chuck table 4 through the protective member 21 in such a manner that the reverse side 11b is exposed upward.

To a lower portion of the frame body 6, a rotary drive source (not illustrated), such as a motor, is coupled. By power generated by the rotary drive source, the chuck table 4 rotates about an axis along or slightly inclined with respect to a vertical direction, such that the center 8b of the upper surface 8a becomes the center of rotation. Further, the frame body 6 is supported by a chuck table moving mechanism (not illustrated), and the chuck table 4 moves in a horizontal direction by power generated by the chuck table moving mechanism.

Figure 3:
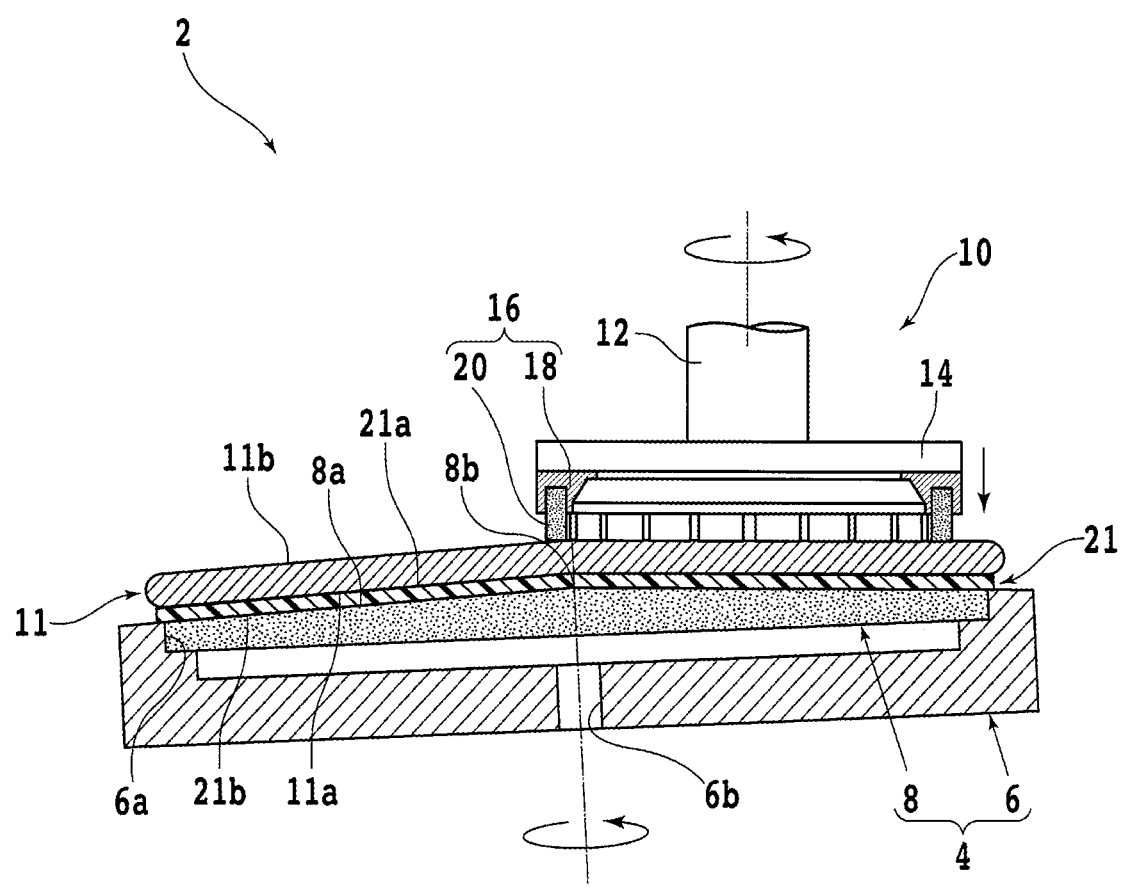
FIG. 3 is a cross sectional view schematically illustrating a state in which grinding of the workpiece by a first grinding wheel is started.
Figure 4:
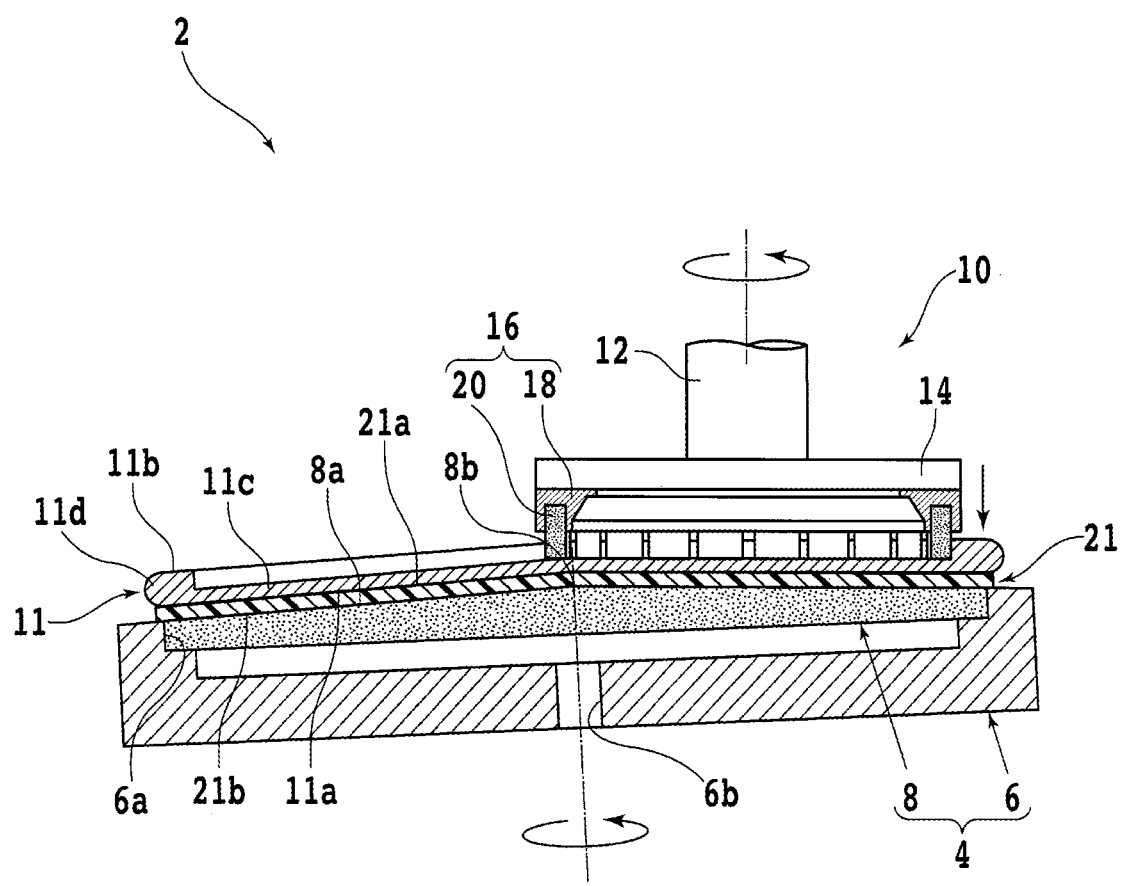
FIG. 4 is a cross sectional view schematically illustrating a state in which grinding of the workpiece by the first grinding wheel is proceeding.

After the workpiece 11 is held on the chuck table 4 through the protective member 21, a portion of the workpiece 11 that corresponds to the area (device area) in which the devices 15 are formed is coarsely ground from the reverse side 11b (first grinding step). FIG. 3 is a cross sectional view schematically illustrating a state in which grinding of the workpiece 11 is started, and FIG. 4 is a cross sectional view schematically illustrating a state in which grinding of the workpiece 11 is proceeding. Note that FIGS. 3 and 4 depict side surfaces of some components for the convenience of description.

As illustrated in FIGS. 3 and 4, a first grinding unit (coarse grinding unit) 10 is disposed at a position above the chuck table 4 of the grinding apparatus 2. The first grinding unit 10 includes, for example, a tubular spindle housing (not illustrated). In a space inside the spindle housing, a columnar spindle 12 is housed.

On a lower end portion of the spindle 12, there is provided, for example, a circular plate-shaped mount 14 that has a smaller diameter than the workpiece 11. To a lower surface of the mount 14, a ring-shaped first grinding wheel (coarse grinding wheel) 16 that has substantially the same diameter as the mount 14 is fixed by a bolt (not illustrated) or the like.

The first grinding wheel 16 includes a ring-shaped wheel base 18 formed with use of such metal as stainless steel or aluminum. To a ring-shaped lower surface of the wheel base 18, there are fixed a plurality of first grindstones (coarse grindstones) 20 along a circumferential direction of the wheel base 18. That is, the plurality of first grindstones 20 are arrayed in an annular area that has a diameter (first diameter) smaller than that of the workpiece 11. Each of the first grindstones 20 has, for example, a structure in which relatively large abrasive grains including diamonds or the like are dispersed in a bonding agent composed of resin or the like.

When the workpiece 11 is ground by the first grinding wheel 16 including the first grindstones 20, the amount of workpiece 11 that can be removed per unit time increases, but a damaged layer including scratches and distortions is more likely to be formed on the ground side of the workpiece 11. To an upper end side of the spindle 12, a rotary drive source (not illustrated), such as a motor, is coupled. By power generated by the rotary drive source, the first grinding wheel 16 rotates about an axis along or slightly inclined with respect to the vertical direction.

Near or inside the first grinding wheel 16, there is provided a nozzle (not illustrated) configured to be capable of supplying grinding liquid (typically, water) to the first grindstones 20 and the like. The spindle housing is, for example, supported by a first grinding unit moving mechanism (not illustrated), and the first grinding unit 10 moves in the vertical direction by power generated by the first grinding unit moving mechanism.

When the workpiece 11 is to be ground by the first grinding unit 10 (first grinding wheel 16), first, the chuck table 4 is moved to a position directly below the first grinding unit 10. More specifically, the chuck table moving mechanism moves the chuck table 4 in the horizontal direction such that the first grinding wheel 16 (all the first grindstones 20) is disposed directly above the area in which the devices 15 are formed.

Thereafter, the chuck table 4 and the first grinding wheel 16 each rotate, and the first grinding unit 10 (first grinding wheel 16) is lowered. That is, while mutually rotating, the first grinding wheel 16 and the workpiece 11 move relative to each other in the vertical direction (first direction) that intersects with the reverse side 11b of the workpiece 11. Note that at this time, liquid is supplied to the first grindstones 20 and the like from the nozzle. As a result, the first grindstones 20 come into contact with the workpiece 11 from the reverse side 11b, and grinding of the workpiece 11 starts, as illustrated in FIG. 3.

Note that there are no significant limitations on specific grinding conditions. For example, in order to realize efficient grinding of the workpiece 11, the rotational speed of the chuck table 4 is set to fall within the range of 100 rpm to 600 rpm, typically to 300 rpm, the rotational speed of the first grinding wheel 16 is set to fall within the range of 1,000 rpm to 7,000 rpm, typically to 4,500 rpm, and the lowering speed (grinding feed speed) of the first grinding unit 10 is set to fall within the range of 0.8 µm/s to 10.0 µm/s, typically to 6.0 µm/s.

As the grinding of the workpiece 11 proceeds, as illustrated in FIG. 4, the portion of the workpiece 11 with which the first grindstones 20 have come into contact becomes thin while the remaining portion is maintained to be thick. That is, the portion of the workpiece 11 that corresponds to the area in which the devices 15 are formed becomes thin and constitutes a circular plate-shaped first thin plate portion 11c. Further, the portion of the workpiece 11 that corresponds to an area (outer peripheral area) surrounding the area in which the devices 15 are formed is maintained to be thick and constitutes an annular first thick plate portion 11d surrounding the first thin plate portion 11c.

Figure 5:
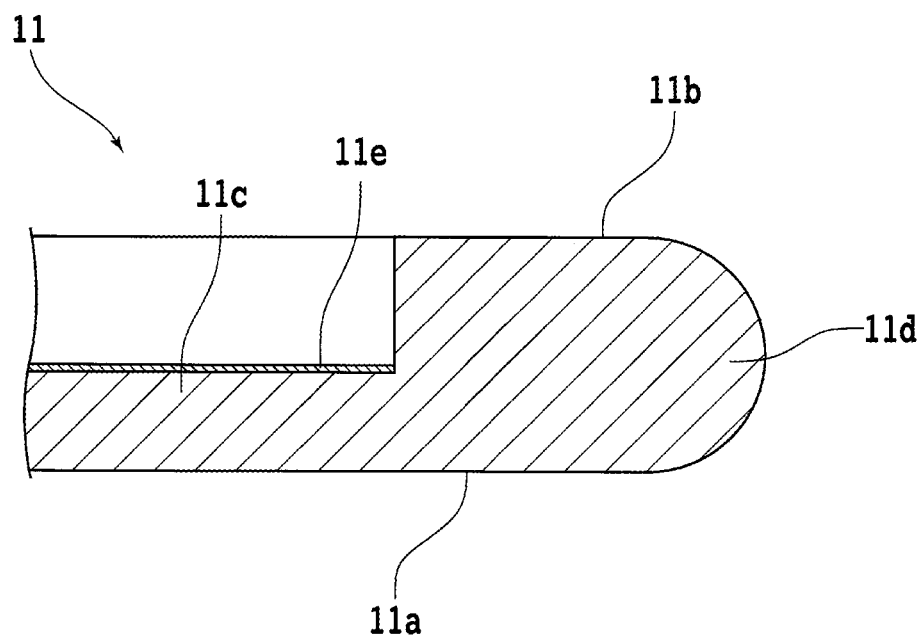
FIG. 5 is a cross sectional view schematically illustrating part of the workpiece that has been ground by the first grinding wheel.

FIG. 5 is a cross sectional view schematically illustrating part of the workpiece 11 that has been ground by the first grinding wheel 16. As illustrated in FIG. 5, a portion (ground side) of the first thin plate portion 11c on the reverse side 11b that has been ground by the first grindstones 20 including relatively large abrasive grains has a damaged layer 11e including scratches or distortions. The damaged layer 11e lowers the mechanical strength (die strength) of the workpiece 11, so that the area in which the damaged layer 11e is present cannot be used for products.

Figure 6:
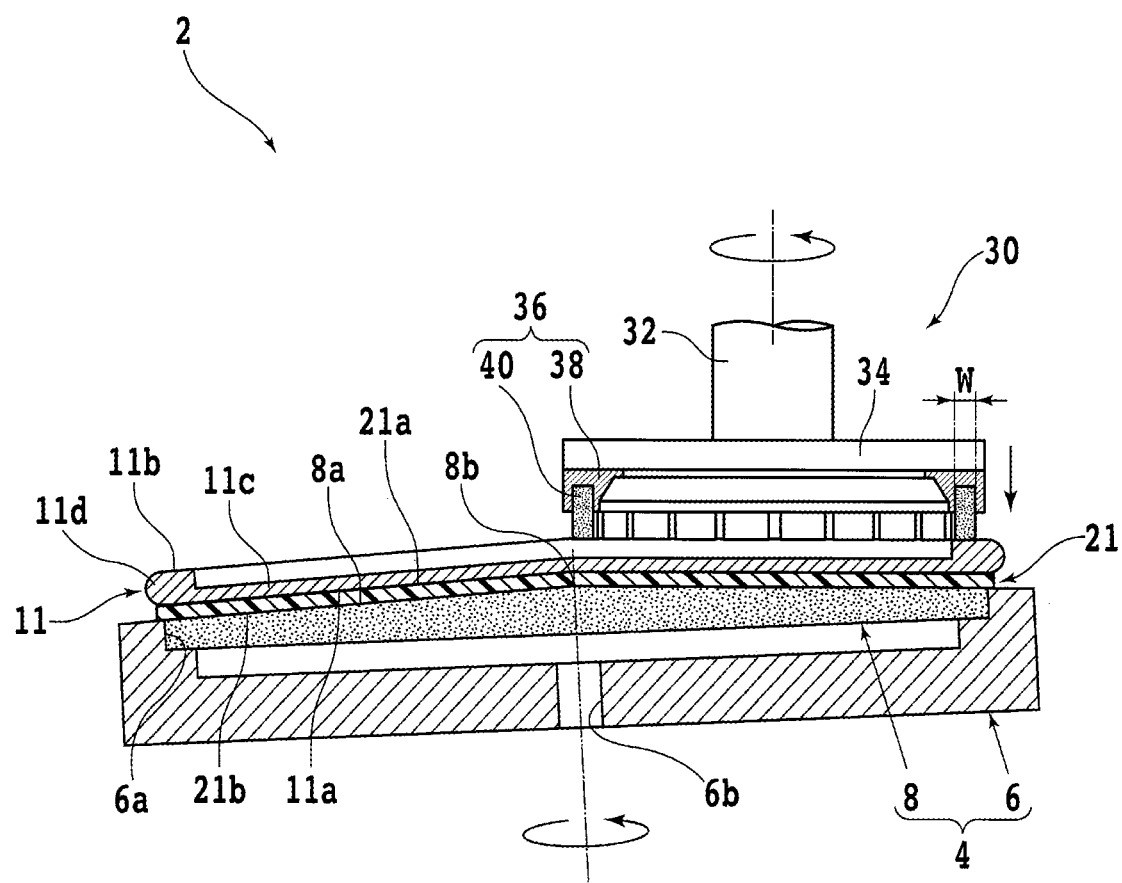
FIG. 6 is a cross sectional view schematically illustrating a state in which grinding of the workpiece by a second grinding wheel is started.
Figure 7:
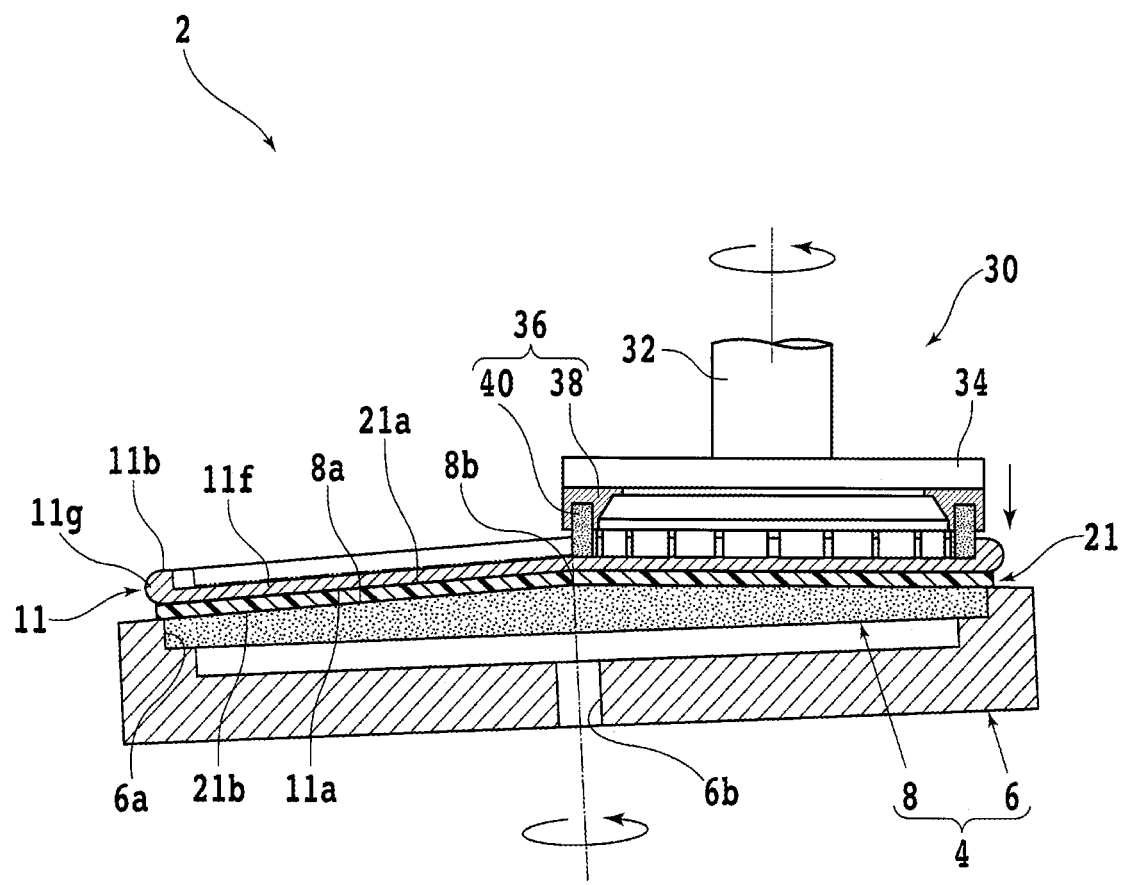
FIG. 7 is a cross sectional view schematically illustrating a state in which grinding of the workpiece by the second grinding wheel is proceeding.

Hence, after performing grinding by the first grinding wheel 16, the first thin plate portion 11c and the first thick plate portion 11d are ground with higher accuracy from the reverse side 11b such that the damaged layer 11e is removed (second grinding step). FIG. 6 is a cross sectional view schematically illustrating a state in which grinding of the workpiece 11 is started, and FIG. 7 is a cross sectional view schematically illustrating a state in which grinding of the workpiece 11 is proceeding. Note that FIGS. 6 and 7 depict side surfaces of some components for the convenience of description.

As illustrated in FIGS. 6 and 7, a second grinding unit (finish grinding unit) 30 different from the first grinding unit 10 is disposed at a position above the chuck table 4 of the grinding apparatus 2. The second grinding unit 30 includes, for example, a tubular spindle housing (not illustrated). In a space inside the spindle housing, a columnar spindle 32 is housed.

On a lower end portion of the spindle 32, there is provided, for example, a circular plate-shaped mount 34 that has a smaller diameter than the workpiece 11. To a lower surface of the mount 34, a ring-shaped second grinding wheel (finish grinding wheel) 36 that has substantially the same diameter as the mount 34 is fixed by a bolt (not illustrated) or the like.

The second grinding wheel 36 includes a ring-shaped wheel base 38 formed with use of such metal as stainless steel or aluminum. To a ring-shaped lower surface of the wheel base 38, there is fixed a plurality of second grindstones (finish grindstones) 40 along a circumferential direction of the wheel base 38. That is, the plurality of second grindstones 40 are arrayed in an annular area that has a diameter (second diameter) smaller than that of the workpiece 11.

Each of the second grindstones 40 has, for example, a structure in which relative small abrasive grans including diamonds or the like are dispersed in a bonding agent composed of resin or the like. Specifically, the size (typically, the average grain size) of the abrasive grains included in the second grindstones 40 is smaller than the size of the abrasive grains included in the first grindstones 20.

When the workpiece 11 is ground by the second grinding wheel 36 including the second grindstones 40, the amount of workpiece 11 that can be removed per unit time becomes small compared to that in the case in which the workpiece 11 is ground by the first grinding wheel 16, but a damaged layer is less likely to be generated. To an upper end side of the spindle 32, a rotary drive source (not illustrated), such as a motor, is coupled. By power generated the rotary drive source, the second grinding wheel 36 rotates about an axis along or slightly inclined with respect to the vertical direction.

Near or inside the second grinding wheel 36, there is provided a nozzle (not illustrated) configured to be capable of supplying grinding liquid (typically, water) to the second grindstones 40 and the like. The spindle housing is, for example, supported by a second grinding unit moving mechanism (not illustrated), and the second grinding unit 30 moves in the vertical direction by power generated by the second grinding unit moving mechanism.

When the workpiece 11 is to be ground by the second grinding unit 30 (second grinding wheel 36), first, the chuck table 4 is moved to a position directly below the second grinding unit 30. More specifically, the chuck table moving mechanism moves the chuck table 4 in the horizontal direction in such a manner that any one of the second grindstones 40 of the second grinding wheel 36 is disposed directly above an area outside an inner edge of the first thick plate portion 11d (outer edge of the first thin plate portion 11c).

In the present embodiment, the chuck table moving mechanism moves the chuck table 4 in the horizontal direction in such a manner that the second grinding unit 30 is lowered and the second grindstones 40 come into contact with an area on the reverse side 11b that is present on the first thick plate portion 11d at a distance of equal to or more than a width W of the second grindstones 40 from an inner edge of the reverse side 11b toward the outer side. Here, the width W of the second grindstones 40 is a width of the second grindstones 40 in a direction of the diameter of the annular area in which the second grindstones 40 are arrayed, and is, for example, 1 mm to 5 mm.

Thereafter, the chuck table 4 and the second grinding wheel 36 each rotate, and the second grinding unit 30 (second grinding wheel 36) is lowered. That is, while mutually rotating, the second grinding wheel 36 and the workpiece 11 move relative to each other in the vertical direction (second direction) that intersects with the reverse side 11b of the workpiece 11. Note that, at this time, liquid is supplied from the nozzle to the second grindstones 40 and the like.

As a result, as illustrated in FIG. 6, the second grindstones 40 come into contact with the first thick plate portion 11d from the reverse side 11b, and grinding of the workpiece 11 starts. As described above, in the present embodiment, the second grindstones 40 come into contact with the area on the reverse side 11b that is present on the first thick plate portion 11d at a distance of equal to or more than the width W of the second grindstones 40 from the inner edge of the reverse side 11b toward the outer side.

That is, the innermost portion of the second grindstones 40 in a direction of the width W always comes into contact with the first thick plate portion 11d at some point in time, so that the wear of the inner portion of the second grindstones 40 can appropriately proceed in association with the wear of the outer portion thereof, preventing uneven wear in which wear of only the outer portion of the second grindstones 40 proceeds.

Note that there are no significant limitations on the specific grinding conditions. For example, in order to realize efficient and highly accurate grinding of the workpiece 11, the rotational speed of the chuck table 4 is set to fall within the range of 100 rpm to 600 rpm, typically to 300 rpm, and the rotational speed of the second grinding wheel 36 is set to fall within the range of 1,000 rpm to 7,000 rpm, typically to 4,000 rpm.

After grinding of the workpiece 11 has proceeded and the inner portion of the first thick plate portion 11$d$ with which the second grindstones 40 come into contact has been removed, the second grindstones 40 come into contact with also the first thin plate portion 11$c$. That is, in the present embodiment, after only the first thick plate portion 11$d$ has been ground, an area including the first thin plate portion 11$c$ (and the first thick plate portion 11$d$) is ground from the reverse side 11$b$.

Here, the load of grinding applied to the second grindstones 40 at a stage where only the first thick plate portion 11$d$ is ground is smaller than the load of grinding applied to the second grindstones 40 at a stage where an area including the first thin plate portion 11$c$ is ground. Accordingly, at the stage where only the first thick plate portion 11$d$ is ground, the speed of lowering the second grinding unit 30 (grinding feed speed) can be increased than that at the stage where the area including the first thin plate portion 11$c$ is ground.

For example, the speed of lowering the second grinding unit 30 at the stage where only the first thick plate portion 11$d$ is ground is set to fall within the range of 0.8 μm/s to 5.0 μm/s, and the speed of lowering the second grinding unit 30 at the stage where the area including the first thin plate portion 11$c$ is ground is set to fall within the range of 0.1 μm/s to 0.8 μm/s. As described above, as a result of the speed of lowering the second grinding unit 30 being increased at the stage where only the first thick plate portion 11$d$ is ground, for example, the length of time required for grinding can be prevented from being considerably long compared to the length of time required in the grinding method in the related art in which the first thick plate portion 11$d$ is not ground.

As the grinding of the workpiece 11 further proceeds, as illustrated in FIG. 7, the portion of the workpiece 11 with which the second grindstones 40 have come into contact further becomes thin while the remaining portion is maintained to be thick. That is, the portion of the workpiece 11 that corresponds to the area in which the devices 15 are formed becomes further thin and constitutes a circular plate-shaped second thin plate portion 11$f$. Further, the portion of the workpiece 11 that corresponds to an area (outer circumferential area) surrounding the area in which the devices 15 are formed is maintained to be thick and constitutes an annular second thick plate portion 11$g$ surrounding the second thin plate portion 11$f$.

Figure 8:
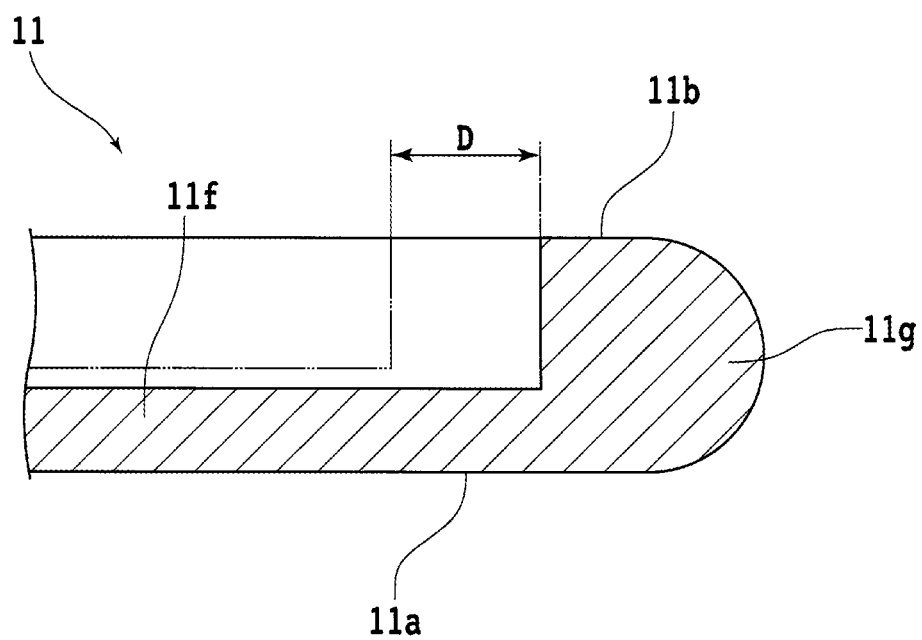
FIG. 8 is a cross sectional view schematically illustrating part of the workpiece that has been ground the second grinding wheel.

FIG. 8 is a cross sectional view schematically illustrating part of the workpiece 11 that has been ground by the second grinding wheel 36. As illustrated in FIG. 8, in a portion (ground side) of the second thin plate portion 11$f$ on the reverse side 11$b$ that has been ground by the second grindstones 40 including relatively small abrasive grains, there remains no substantial damaged layer 11$e$. Accordingly, the second thin plate portion 11$f$ in whole becomes an effective area that can be used for products.

As illustrated in FIG. 8, the edge of the second thin plate portion 11$f$ is formed on the outer side of the edge of the first thin plate portion 11$c$ by a distance D that has a value equal to or more than the width W of the second grindstones 40. The inner edge of the second thick plate portion 11$g$ is formed on the outer side of the inner edge of the first thick plate portion 11$d$ by the distance D. That is, a difference between the diameter of the second thin plate portion 11$f$ and the diameter of the first thin plate portion 11$c$ and a difference between the width of the second thick plate portion 11$g$ and the width of the first thick plate portion 11$d$ are both equal to double the distance D.

For example, if the area of the workpiece 11 in which the devices 15 are formed is included in the effective area, all the devices 15 can be used as products. In this case, the diameter of the second thin plate portion 11$f$ becomes equal to or more than the diameter of the area in which the devices 15 are formed. Accordingly, the diameter of the first thin plate portion 11$c$ sometimes becomes smaller than the diameter of the area in which the devices 15 are formed.

As described above, in the grinding method according to the present embodiment, after the workpiece 11 is ground by the first grinding wheel 16 including the first grindstones 20 and the first thin plate portion 11$c$ and the first thick plate portion 11$d$ are formed, the first thick plate portion 11$d$ and the first thin plate portion 11$c$ are ground by the second grinding wheel 36 including the second grindstones 40 that include abrasive grains smaller than those of the first grindstones 20, to form the second thin plate portion 11$f$ and the second thick plate portion 11$g$, so that the second thin plate portion 11$f$ in whole becomes an effective area that has no damaged layer 11$e$ generated by the first grindstones 20.

Further, the volume of portion of the first thick plate portion 11$d$ removed by the second grinding wheel 36 is sufficiently small, so that the length of time required for grinding does not become considerably long compared to the length of time required in the grinding method in the related art in which the second grinding wheel 36 grinds only the area on the central side of the first thin plate portion 11$c$ and not the first thick plate portion 11$d$ at all. Accordingly, the grinding method according to the present embodiment reserves, to a maximum extent, an effective area that can be used for products without requiring a considerably longer time than the grinding method in the related art.

Further, in the grinding method according to the present embodiment, at the time of grinding the first thick plate portion 11$d$ and the first thin plate portion 11$c$ by the second grinding wheel 36, the second grindstones 40 come into contact with the area on the reverse side 11$b$ that is present on the first thick plate portion 11$d$ at a distance of equal to or more than the width W of the second grindstones 40 (the width of the second grindstones 40 in the direction of the diameter (second diameter) of the annular area in which the second grindstones 40 are arrayed) from the inner edge of the reverse side (second surface) 11$b$ toward the outer side.

As a result, the innermost portion of the second grindstones 40 (the portion in the innermost position in the direction of the diameter (second diameter) of the annular area in which the second grindstones 40 are arrayed) always comes into contact with the first thick plate portion 11$d$ at some point in time, so that the wear of the inner portion of the second grindstones 40 can appropriately proceed in association with the wear of the outer portion thereof, preventing uneven wear in which only the outer portion of the second grindstones 40 wears from proceeding.

Note that the present invention can be implemented with various modifications without being limited to the description in the above-mentioned embodiment. As described above, the position of the first grinding wheel 16 with respect to the workpiece 11 and the position of the second grinding wheel 36 with respect to the workpiece 11 have a deviation equal to or more than the width W (distance D) of the second grindstones 40.

Hence, the diameter (first diameter) of the annular area in which the first grindstones 20 are arrayed and the diameter (second diameter) of the annular area in which the second grindstones 40 are arrayed are not necessarily required to be equal. For example, the diameter of the annular area in which the second grindstones 40 are arrayed may be larger than the diameter of the annular area in which the first grindstones 20 are arrayed.

Figure 9:
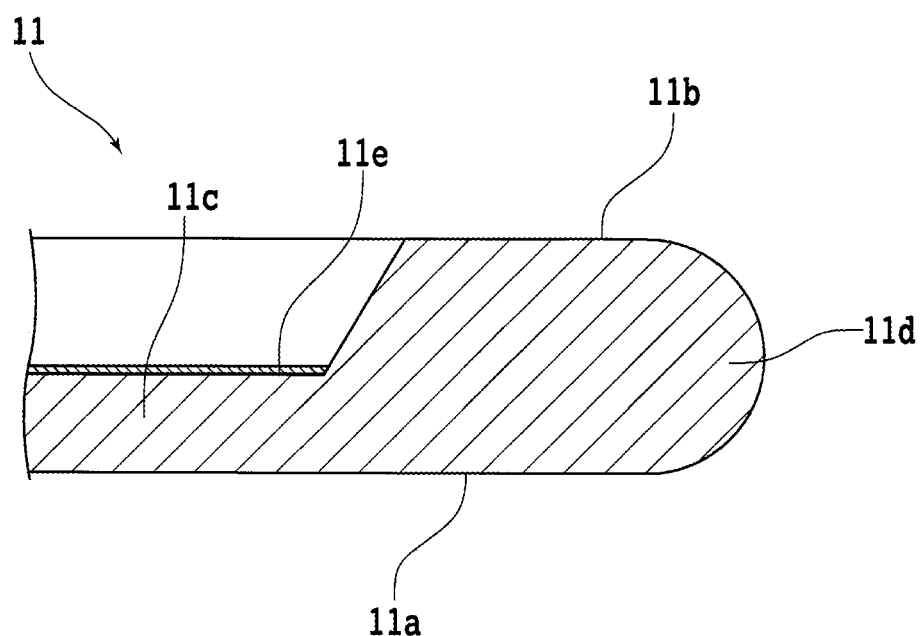
FIG. 9 is a cross sectional view schematically illustrating part of the workpiece that has been ground by the first grinding wheel in a grinding method according to a modification.

Further, when the workpiece 11 is to be ground by the first grinding wheel 16, the center of rotation of the first grinding wheel 16 and the center of rotation of the workpiece 11 may be caused to come close to each other in a direction parallel to the reverse side 11*b* while the first grinding wheel 16 and the workpiece 11 are moved relative to each other in a direction perpendicular to the reverse side 11*b*. FIG. 9 is a cross sectional view schematically illustrating part of the workpiece 11 that has been ground by the first grinding wheel 16 in the grinding method according to a modification.

As illustrated in FIG. 9, in this modification, the inner side surface of the first thick plate portion 11*d* is tilted with respect to the reverse side 11*b* of the workpiece 11 such that the space defined by the first thin plate portion 11*c* and the first thick plate portion 11*d* has an inverted cone shape. That is, the outer side surface of the first grindstones 20 does not come into contact with the workpiece 11, so that uneven wear of the first grindstones 20 can be prevented from proceeding.

Figure 10:
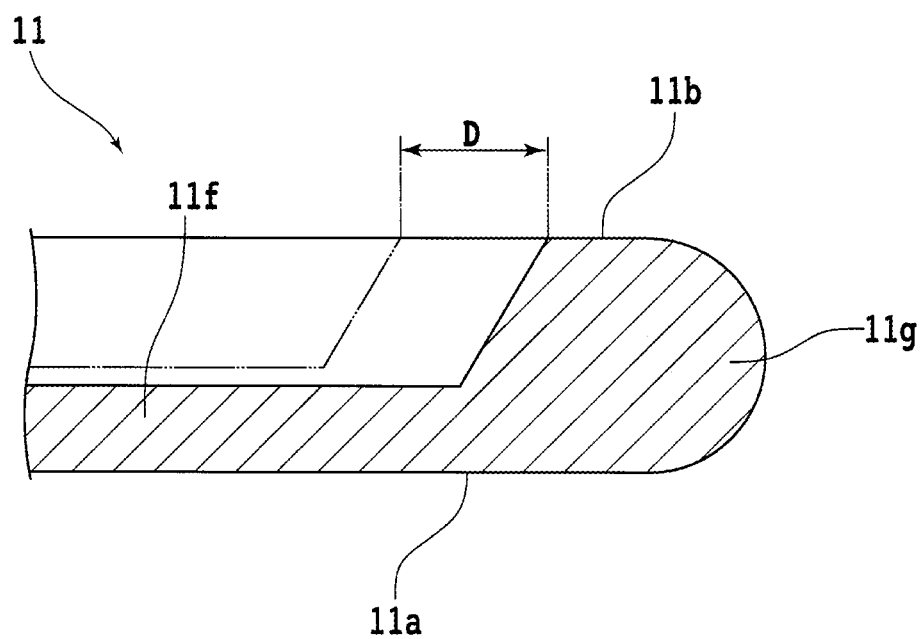
FIG. 10 is a cross sectional view schematically illustrating part of the workpiece that has been ground by the second grinding wheel in the grinding method according to the modification.

Similarly, when the workpiece 11 is to be ground by the second grinding wheel 36, the center of rotation of the second grinding wheel 36 and the center of rotation of the workpiece 11 may be caused to come close to each other in a direction parallel to the reverse side 11*b* while the second grinding wheel 36 and the workpiece 11 are moved relative to each other in a direction perpendicular to the reverse side 11*b*. FIG. 10 is a cross sectional view schematically illustrating part of the workpiece 11 that has been ground by the second grinding wheel 36 in the grinding method according to this modification.

As illustrated in FIG. 10, in this modification, the inner side surface of the second thick plate portion 11*g* is tilted with respect to the reverse side 11*b* of the workpiece 11 such that the space defined by the second thin plate portion 11*f* and the second thick plate portion 11*g* has an inverted cone shape. That is, the outer side surface of the second grindstones 40 does not come into contact with the workpiece 11, so that uneven wear of the second grindstones 40 can further be prevented from proceeding.

Further, the workpiece 11 may be ground by a grinding apparatus including a chuck table that holds the workpiece 11 when the workpiece 11 is to be ground by the first grinding wheel 16 and another chuck table that holds the workpiece 11 when the workpiece 11 is to be ground by the second grinding wheel 36. Similarly, the workpiece 11 may be ground by a grinding apparatus including the first grinding unit 10 and another grinding apparatus including the second grinding unit 30.

In addition, structures, methods, and the like according to the embodiment and the modification can be implemented with various modifications without departing from the gist of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A grinding method applied when a circular workpiece having a first surface and a second surface on an opposite side of the first surface is to be ground from the second surface, the grinding method comprising:
    a first grinding step of moving the workpiece and a first grinding wheel in which a plurality of first grindstones each including abrasive grains are arrayed in an annular area with a first dimeter smaller than a diameter of the workpiece relative to each other in a first direction that intersects with the second surface, while mutually rotating the workpiece and the first grinding wheel, and causing the first grindstones to come into contact with the workpiece from the second surface side, to grind the workpiece and thereby form on the workpiece a circular first thin plate portion and an annular first thick plate portion surrounding the first thin plate portion; and
    a second grinding step of, after the first grinding step, moving the workpiece and a second grinding wheel in which a plurality of second grindstones each including abrasive grains smaller than those included in the first grindstones are arrayed in an annular area with a second diameter smaller than the diameter of the workpiece relative to each other in a second direction that intersects with the second surface, while mutually rotating the workpiece and the second grinding wheel, and causing the second grindstones to come into contact with the first thick plate portion and the first thin plate portion from the second surface side, to grind the workpiece and thereby form on the workpiece a circular second thin plate portion that has a larger diameter than the first thin plate portion and an annular second thick plate portion surrounding the second thin plate portion, wherein,
    in the second grinding step, the second grindstones are caused to come into contact with an area on the second surface that remains on the first thick plate portion at a distance of equal to or more than a width of the second grindstones in a direction of the second diameter from an inner edge of the second surface toward an outer side.

2. The grinding method according to claim 1, wherein, in the first grinding step, while the first grinding wheel and the workpiece are moved relative to each other in a direction perpendicular to the second surface, a center of rotation of the first grinding wheel and a center of rotation of the workpiece are caused to come closer to each other in a direction parallel to the second surface.

3. The grinding method according to claim 1, wherein, in the second grinding step, while the second grinding wheel and the workpiece are moved relative to each other in a direction perpendicular to the second surface, a center of rotation of the second grinding wheel and a center of rotation of the workpiece are caused to come closer to each other in a direction parallel to the second surface.

4. The grinding method according to claim 2, wherein, in the second grinding step, while the second grinding wheel and the workpiece are moved relative to each other in the direction perpendicular to the second surface, a center of rotation of the second grinding wheel and a center of rotation of the workpiece are caused to come closer to each other in the direction parallel to the second surface.

5. The grinding method according to claim 1, wherein the workpiece comprises silicon.

6. The grinding method according to claim 1, wherein the first surface of the workpiece comprises a device area in which devices are formed and the second thin plate portion corresponds to the device area.

7. The grinding method according to claim 6, wherein the devices are integrated circuits.

8. The grinding method according to claim 1, wherein the first surface of the workpiece comprises a device area in which devices are formed and the diameter of the second thin plate portion is equal to or more than a diameter of the device area.

9. The grinding method according to claim 1, wherein the first surface of the workpiece comprises a device area in which devices are formed and wherein the second diameter of the plurality of second grindstones is larger than the diameter of the device area.

10. The grinding method according to claim 1, wherein the first surface of the workpiece comprises a device area in which devices are formed and the diameter of the first thin plate portion is smaller than the diameter of the device area.

11. The grinding method according to claim 1, wherein the workpieice is held on a chuck table during the first grinding step and during the first grinding step:
a rotational speed of the chuck table is set to fall within the range of 100 rpm to 600 rpm and
the rotational speed of the first grinding wheel is set to fall within the range of 1,000rpm to 7,000 rpm; and
a grinding feed speed is set to fall within the range of 0.8 µm/s to 10.0 µm/s.

12. The grinding method according to claim 11, wherein the rotational speed of the chuck table is set to 300 rpm, the rotational speed of the first grinding wheel is set to 4,500 rpm, and the grinding feed speed is set to 6.0 µm/s.

13. The grinding method according to claim 1, wherein during the first grinding step a damaged layer is formed in the first thin plate portion and wherein during the second grinding step, the damaged layer formed during the first grinding step is removed.

14. The grinding method according to claim 1, wherein the width of the second grindstones in a direction of the second diameter from an inner edge of the second surface toward an outer side is 1 mm to 5 mm.

15. The grinding method according to claim 1, wherein the workpieice is held on a chuck table during the second grinding step and during the second grinding step:
a rotational speed of the chuck table is set to fall within the range of 100 rpm to 600 rpm and
the rotational speed of the first grinding wheel is set to fall within the range of 1,000rpm to 7,000 rpm.

16. The grinding method according to claim 15, wherein the rotational speed of the chuck table is set to 300 rpm, the rotational speed of the first grinding wheel is set to 4,000 rpm.

17. The grinding method according to claim 15, wherein during the second grinding step a grinding feed speed is adjusted is and set to a higher speed when only the first thick plate portion is being ground than when an area including the first thin plate portion is being ground.

18. The grinding method according to claim 17, wherein the grinding feed speed during the second grinding step is set to fall within the range of 0.8 µm/s to 5.0µm/s when only the first thick plate portion is being ground and is set to fall within the range of 0.1 µm/s to 0.8 µm/s when an area including the first thin plate portion is being ground.

19. The grinding method according to claim 1, wherein during the first grinding step outer side surfaces of the first grindstones do not come into contact with the workpiece; and
wherein the second grinding step outer side surfaces of the second grindstones do not come into contact with the workpiece.

20. The grinding method according to claim 19, wherein the annular first thick plate portion surrounding the first thin plate portion has an inner side surface that is tilted with respect to the first surface of the workpiece; and
wherein the annular second thick plate portion surrounding the second thin plate portion has an inner side surface that is tilted with respect to the first surface of the workpiece.

* * * * *